United States Patent [19]
Kenington et al.

[11] Patent Number: 5,576,659
[45] Date of Patent: Nov. 19, 1996

[54] METHOD AND APPARATUS FOR SIGNAL PROCESSING USING REFERENCE SIGNALS

[75] Inventors: Peter B. Kenington, Winterbourne; Mark A. Beach, Lower Langford; Joseph P. McGeehan, Corsham, all of England

[73] Assignee: British Technology Group Limited, London, England

[21] Appl. No.: 448,523

[22] PCT Filed: Nov. 19, 1993

[86] PCT No.: PCT/GB93/02379

§ 371 Date: Jun. 14, 1995

§ 102(e) Date: Jun. 14, 1995

[87] PCT Pub. No.: WO94/14238

PCT Pub. Date: Jun. 23, 1994

[30] Foreign Application Priority Data

Dec. 15, 1992 [GB] United Kingdom ............... 9226145
Feb. 18, 1993 [GB] United Kingdom ............... 9303248

[51] Int. Cl.⁶ ........................... H03F 3/66; H03F 1/26
[52] U.S. Cl. ......................... 330/52; 330/151; 330/149
[58] Field of Search ............................ 330/52, 149, 151

[56] References Cited

U.S. PATENT DOCUMENTS

| | | | |
|---|---|---|---|
| 3,624,532 | 11/1971 | Seidel | 330/9 |
| 4,394,624 | 7/1983 | Bauman | 330/151 |
| 4,580,105 | 4/1986 | Myer | 330/149 |
| 4,962,507 | 10/1990 | Renshaw | 375/1 |
| 5,130,663 | 7/1992 | Tattersall, Jr. | 330/52 |
| 5,157,345 | 10/1992 | Kenington et al. | 330/149 |
| 5,166,634 | 11/1992 | Narahashi et al. | 330/151 |
| 5,327,096 | 7/1994 | Sakamoto et al. | 330/151 |
| 5,334,946 | 8/1994 | Kenington | 330/149 |
| 5,386,198 | 1/1995 | Ripstrand et al. | 330/52 |
| 5,455,537 | 10/1995 | Larkin et al. | 330/52 |

FOREIGN PATENT DOCUMENTS 9417587  8/1994  WIPO.

OTHER PUBLICATIONS

Vehicular Technology society 42nd VTS Conference Frontiers of Technology, vol. 1 of 2, pp. 1–576 S. A. Allpress et al, pp. 506–510.

Introduction to Spread–Spectrum Antimultipath Techniques and Their Application to Urban Digital Radio G. L. Turin, Proceedings of the IEEE, vol. 68, No. 3, Mar. 1980, pp. 328–353.

Principles of Communication System 1980 Taub et al, pp. 720–749.

*Primary Examiner*—Steven Mottola
*Attorney, Agent, or Firm*—Cushman, Darby & Cushman

[57] ABSTRACT

The invention provides methods and apparatus for substituting a reference spread spectrum signal for a pilot tone or providing a reference spread spectrum signal where no pilot tone has been used. The invention has particular relevance when a large number of input channels are required for a broad band linear amplifier and when an omni-directional antenna is required for a repeater which may be prone to instability.

30 Claims, 4 Drawing Sheets

METHOD AND APPARATUS FOR SIGNAL PROCESSING USING REFERENCE SIGNALS

FIELD OF THE INVENTION

The present invention relates to methods and apparatus for substituting another type of signal for a pilot signal where the pilot signal would provide a reference for level and/or frequency and/or phase, for example. The invention also, of course, relates to applications where a reference signal is required but no pilot signal has previously been used or contemplated.

BACKGROUND OF THE INVENTION

The disadvantages of pilot signals include additional loading for any circuit which uses the pilot signal, the provision of a slot in the frequency spectrum for a pilot signal where it does not interfere with other signals, and where the pilot signal is used to characterize changes in a transmission path, the characterization is strictly speaking only applicable to the frequency region occupied by the pilot signal.

The present invention is particularly useful in the removal of distortion in broadband linear amplifiers such as are described in U.S. Pat. Nos. 5,334,946 and 5,157,345. Another method of reducing distortion in such amplifiers is described in U.S. Pat. No. 4,580,105 assigned to A.T & T (inventor Myer). The correction method of this U.S. Pat. No. 4,580,105 suffers from the above mentioned disadvantages and a further disadvantage in that the pilot signal restricts channel usage within the amplifier where a multi-channel input is applied to the amplifier. Previously mentioned U.S. Pat. No. 5,334,946 and 5,157,345 overcame these problems by avoiding the use of a pilot signal but a further problem exists in the particular situation where it is required to combine a large number of input channels for application to the broadband linear amplifier. Such an amplifier is usually used as the final power amplifier of a radio transmitter and for this reason it must be near a transmission antenna. The antenna is usually situated on the top of a building where rentals are high. A large number of input cables, one for each input channel, for example 30 to 100, have to be run to the top floor of this building. In addition some circuits have to be duplicated for each channel near the amplifier and high rental space is required for this purpose.

Another important application of the invention is in radio repeaters, especially for cellular radio, where a repeater for a "hole" in coverage, for example in a tunnel, receives signals at a low level and transmits at a high level on the same frequency. Instability is likely in such repeaters but can usually be avoided by using directional antennas and positioning transmit and receive antennas as far apart as possible. However in many situations one omnidirectional antenna is required and suitable spacing is inconvenient. A similar application which uses a derivative of the technique is in frequency translating repeaters. An advantage then gained is the elimination of the complex filtering otherwise required in these systems.

In code-division multiple access (CDMA) systems each channel employs a spread spectrum signal and the channel signals are added before transmission. U.S. Pat. No. 4,962,507 describes a system in which a pilot signal for transmitting a timing reference is also transmitted in spread spectrum form.

SUMMARY OF THE INVENTION

According to a first aspect of the present invention there is provided a method of processing signals comprising the steps of combining a spread spectrum signal with an input signal to be processed, processing the combined signals to provide an output signal, deriving an intermediate signal dependent on the processed combined signals and adjusting the phase and/or amplitude of the intermediate signal in response to control signals, combining the adjusted intermediate signal with the input or the output signal of the processing to improve processing, and deriving the control signals from the output signal.

Methods according to the first aspect of the invention, and corresponding apparatus, may be used where the signals to be processed are spread spectrum signals.

According to a second aspect of the present invention there is provided a method of processing signals comprising the steps of combining a reference signal, having a predetermined characteristic, with the input signals which are not spread spectrum modulated, processing the combined input-and reference signals to provide processed signals, and extracting a signal representative of the characteristics from the processed signals to control, at least partially, the processing and/or further processing of the processed signals, wherein the reference signal is a spread spectrum signal.

The second aspect of the invention is based on the realization that a spread spectrum reference signal can be used in a system which does not otherwise employ spread spectrum signals.

The advantages of the invention include not having to provide a portion of the spectrum for a pilot signal so that for example in multichannel usage more of the spectrum is available for channels. Since the spread spectrum signal is a noise-like signal little additional load is imposed at any particular frequency and any components remaining in output signals appear as noise.

Thus the invention can be used in many applications to replace a conventional pilot signal. Most advantage is gained with wide bandwidth systems and for narrow band systems a conventional pilot signal is usually better.

Where the reference signal is used to characterize a circuit or transmission link, the characterization is broadband.

A number of respective spread spectrum reference signals can be used simultaneously if orthogonal random sequences are used to generate the spread spectrum signals, since each reference signal can be compared, or its non-random generating signal can be recovered, using its particular reference sequence. Thus multiple reference signals can be used in the same circuit for different purposes, or for similar purposes in different parts of the same circuit.

Other advantages include the ability to work with any modulation scheme. Most control techniques can be easily modified for use with spread spectrum reference signals since conversion to this form and comparison, or recovery of a non-random signal, employs simple known methods and circuits.

In the radio repeater application mentioned above, the spread spectrum signal can be used, as is described in more detail below, to identify a portion of a transmitted signal which has been received by the repeater's receive antenna. This portion is then subtracted from the input signal to the repeater's amplifier after phase and amplitude adjustment in much the same way as is the broad band amplifier application to provide an interference free signal for transmission at high power to avoid instability.

Extracting the said characteristic may include using a spread spectrum reference signal or a replica thereof for comparison with the spread spectrum signal forming part of the processed signals, or recovering a non-random signal used in generating the spread spectrum signal from the processed signals. Recovery may be using the same random sequence as for conversion; for example by using the same or a similar random signal generator for recovery as for conversion.

Since the characteristic can be used either in controlling processing after extraction of the characteristic or before extraction, control can be seen to be either feedforward or feedback.

The characteristic may or may not be modified when the combined input and reference signals are processed.

In the broadband amplifier application mentioned above, it is the degree to which the reference signal exists in the amplifier output which is important, that is its level, since in this application the reference signal can be regarded as a form of specifically introduced distortion signal.

Thus in some forms of processing the characteristic may be modified between combination and use, and it may be that the degree or way in which modification has occured is the function of the characteristic which is needed for processing.

In another example, the level of the reference signal may be the characteristic, for instance when processing includes transmission by some means from one location to another and variable attenuation experienced by the input and reference, signal is to be compensated when processing is carried out.

In some other forms of processing the characteristic of the reference signal may be one which is required to be as far as possible unchanged between combination with the input signals and its use in the control of processing. For example, the frequency of the above mentioned non-random signal may be the characteristic, for instance when processing comprises demodulation using a signal derived from the reference signals.

Thus the characteristic may be frequency or signal level, but other possibilities include phase, or a combination of characteristics.

The spread spectrum signal may be of any type, for example, one generated by changing frequency of a signal generator according to a random sequence or by combining a series of pulses representing "ones" and "zeros" with a tone. Other systems which may be used include time hopping in which signal bursts are randomly sequenced in time and chirp systems in which each signal burst has a narrow frequency bandwidth which rapidly sweeps the entire bandwidth.

According to a third aspect of the invention there is provided a broadband linear amplifier comprising
   amplifier means,
     first difference means for deriving an error signal, representative of distortion introduced by the amplifier means, from signals representative of input signals applied to the amplifier means.
     second difference means for subtracting a signal representative of the error signal from the amplifier means output signals to provide low distortion output signals, and
   adjustment means responsive to control signals for adjusting the relative phase and amplitude of signals applied to at least one of the difference means,
   wherein means are provided for generating a spread spectrum reference signal and combining the reference signal with the input signals after the signals representative of the input signals are derived from the first difference means, and
   control means are also provided for generating the control signals from both the spread spectrum signal as it appears in the low distortion signals and a signal representative of the spread spectrum signal used for combination with the input signals or the error signal.

According to a fourth aspect of the invention there is provided a repeater comprising
   an amplifier coupled between receive and transmit points,
   means for deriving a cancellation signal representative of the amplified output signal,
   means for adjusting the amplitude and phase of the cancellation signal in response to control signals,
   difference means for subtracting the cancellation signal from signals received at the receive point to provide input signals for the amplifier having reduced interference between signals to be amplified by the repeater and signals transmitted at the transmit point,
   means for combining the input signals with a spread spectrum reference signal, and
   means for deriving the control signals from the reference signal and the said input signals.

BRIEF DESCRIPTION OF THE DRAWINGS

Certain embodiments of the invention will now be described with reference to the accompanying drawings, in which.

DESCRIPTION OF PREFERRED EMBODIMENTS

Figure 1:
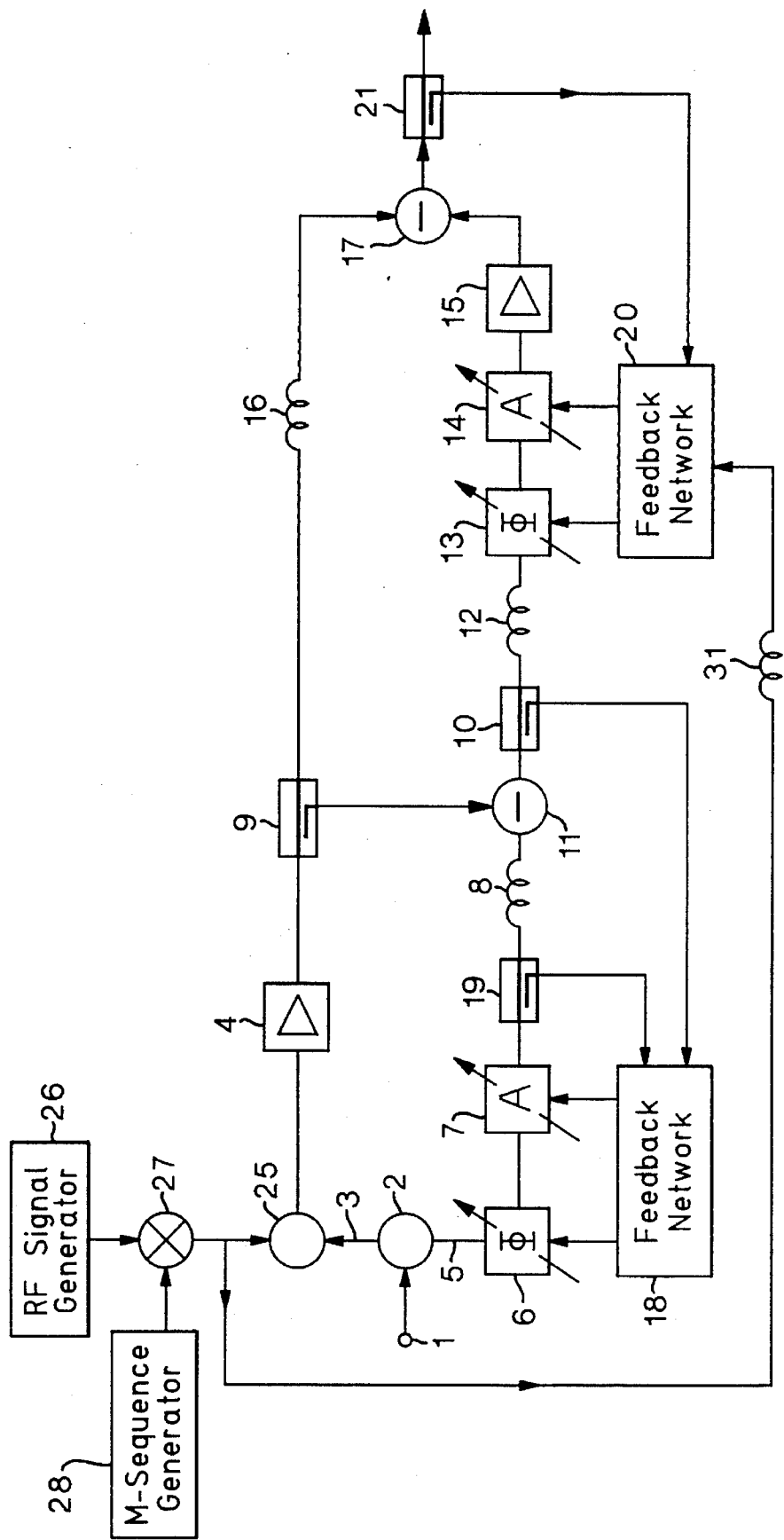
FIG. 1 is a block diagram of a broadband linear amplifier according to the invention.

FIG. 1 is similar to FIG. 1 of the above mentioned U.S. Pat. Nos. 5,334,946 and 5,157,345 except that the feedback network 20 develops control signals for the phase adjustment component 13 and the gain adjustment 14 partly by means of the spread spectrum technique of the present invention. However, FIG. 1 will be described as a whole leaving some details to be obtained from the earlier application.

An input signal is applied at an input terminal 1 and is divided by a splitter 2 between two paths: a main path 3 to a main amplifier 4 and a subsidiary path 5 to phase and gain adjustment components 6 and 7. The output signal from the main amplifier 4 includes distortion products in the form of intermodulation but in addition a spread spectrum signal is introduced at a combiner 25. An RF signal generator 26 supplies an RF carrier at the center of the frequency band of the input signals to a mixer 27 which also receives squarewave, or filtered squarewave, signals from a maximum length pseudo-random sequence generator 28 at baseband and having a bandwidth equal to or less than that of the input signals. In this known way a direct sequence spread spectrum signal (see "Principles of Communication Systems" (2nd Edition), H. Taub and D. L. Schilling, McGraw Hill 1986, Chapter 17, pages 720 to 749) is applied by way of the combiner 25 to the input of the main amplifier 4. Thus the output from the amplifier 4 includes not only the distortion products but also the spread spectrum signal spread across the whole band of the input signals by means of the random noise-like signal from the generator 28 which is mixed with the RF signal from the generator 26. Of course other methods of introducing a spread spectrum signal across the whole or part of the band of the input signal may be used to inject a spread spectrum signal into the input of the main amplifier 4.

A portion of the main amplifier output is obtained from a directional coupler 9 and fed as a first input to a combiner 11. A second input for the combiner 11 from the input terminal 1 is arranged to be in antiphase to the portion of the power amplifier output (thus forming a subtractor) by select, on of a time delay element 8, and a correct adjustment of the phase shift component 6. For optimum cancellation of the input signal to provide an error signal at the output of the combiner 11, the amplitude levels must also be adjusted and this is arranged by correct adjustment of the variable gain component 7. The signal obtained from the output of the subtractor 11, in theory, contains only the distortion products and the spread spectrum signal, and thus forms an error signal.

The error signal is used to cancel the distortion products and the spread spectrum signal present in the output of the main amplifier 4. The main amplifier signal at the output of the directional coupler 9 is delayed by a time delay element 16 and fed to one input of a directional coupler 17 acting as a subtractor. The other input of the directional coupler 17 is obtained by processing the error signal derived previously from the combiner 11 (acting as a subtractor) using a time delay element 12, phase and gain adjustment components 13 and 14, and an error amplifier 15. The variable gain and phase shift components 13 and 14 are adjusted for maximum cancellation of the unwanted distortion products present in the output signal of the coupler 17 and also to allow for phase and amplitude errors in the amplifier 15. The presence of the spread spectrum signal allows adjustment of the components 13 and 14 to be optimized for the whole frequency band and to operate when distortion products are at a very low level.

Adjustment of the phase and gain components 6 and 7 is by means of a feedback network 18 which is as described in the above mentioned patents and which derives input signals from couplers 10 and 19. Correction of phase and gain of the error signal generated at the output of the combiner 11 is under the control of a feedback network 20 which applies control signals to the phase and gain adjustment components 13 and 14. The network 20 is also as described in the previous specification, that is it is the same as the network 18 but one of the signals applied to the input of this network comes from a different point from that of the previous application. The signal which is the same comes from the same point, and is from a directional coupler 21 while the other signal comes from the mixer 27 by way of a time delay element 31: that is, it is the spread spectrum signal injected at the input of the amplifier 4. Thus the feedback network 20 is able to compare any remnant of the spread spectrum signal in the coupler 21 with the original injected spread spectrum signal.

In operation the error signal at the output of the combiner 11 which contains both distortion components and the spread spectrum signal passes through the phase and gain adjusters 13 and 14 to the subtraction circuit 17 where the phase and gain of the distortion components and the spread spectrum signal are such that these components and the corresponding spread spectrum signal from the amplifier 4 are cancelled. Any residual distortion components or spread spectrum signal components are fed back from the directional coupler 21 to the feedback network 20. As a result of the two input signals it receives this network adjusts the phase component 13 and the gain component 14 such that cancellation in the circuit 17 is optimum. Since the spread spectrum signal is spread over the whole bandwith the adjustment of the components 13 and 14 is optimum for the whole bandwidth.

In the above mentioned previous specification several forms of the feedback network 20 were described and in one a digital signal processor (DSP) was used. As explained in the previous specification it is preferable that a DSP operates at audio frequencies and for this reason the circuit of FIG. 2 may be used.

Figure 2:
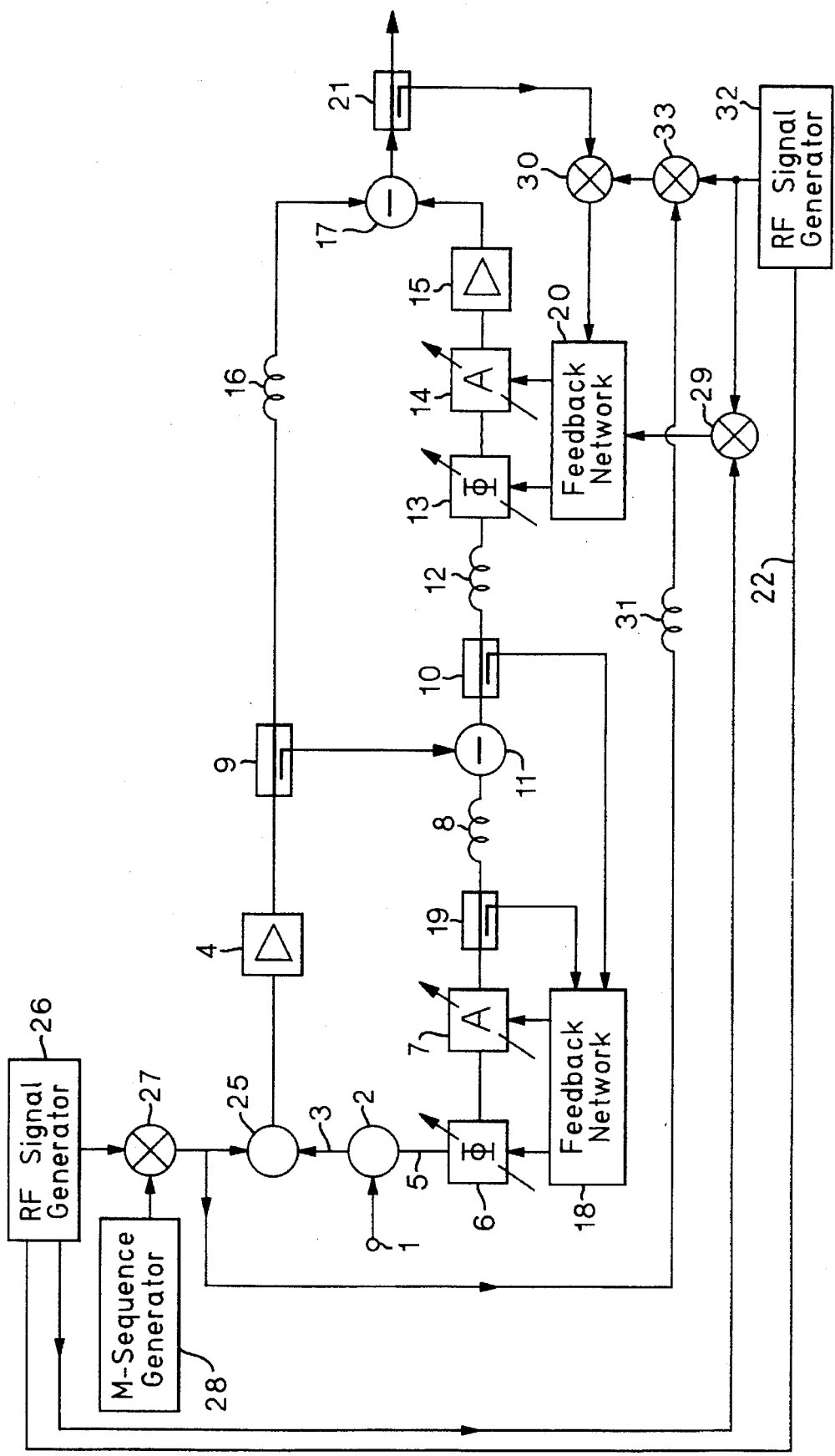
FIGS. 2 and 3 are block diagrams of further broadband linear amplifiers according to the invention, each employing a digital signal processor to act as a feedback control network.

FIG. 2 is similar to FIG. 1 except that the feedback network 20 is in the form of a DSP (not shown) and circuits are provided to give input signals for the network at audio frequencies. A generator 32 provides a signal at a frequency offset from that of the generator 26 by an amount equal to the input frequency required by the DSP to one input of each of mixers 29 and 33. Thus the generators 26 and 32 may have output signals at 900 MHz and 900.00125 MHz for example. The mixer 29 then has an output at 1.25 KHz and, assuming that the M-sequence generator 28 has an output signal band from 0 to 30 MHz, the output of the mixer 33 has an output signal band from 900.00125 to 930.00125 MHz. When this latter band is mixed with the signal from the coupler 21 in a mixer 30, the output is an error signal at 1.25 KHz. The DSP thus receives input signals at suitable frequencies and may be programmed in the same ways as described in U.S. Pat. Nos. 5,334,946 and 5,157,345.

The generators 26 and 32 may include integrated circuit signal generators derived from a 10 MHz reference with the appropriate output signals derived therefrom either internally or externally. The generators should be frequency locked as indicated by a connection 22.

Where a number of input channels are to be combined at one location and then applied as an input signal to the amplifier 4 and the distortion minimizing circuits of FIG. 1 at a remote location, then the input signals are added, in the same way as shown later in FIG. 3, before application to the input terminal 1. A suitable connection joins the additional circuit used for this purpose and the splitter 2. The advantage obtained is that the numerous splitters 23 of FIG. 2 of the above mentioned U.S. Pat. No. 5,157,345 and the phase and gain adjustment components 24 and 25 of that figure which would have to be at the same location as the amplifier 4 are no longer required and a single connection replaces the inputs to the combiner 28 of that figure. There may be thirty or more input channels so the circuits of FIGS. 1 and 2 of the present application provide a useful advantage especially where summing can be carried out at a relatively low rental location such as the basement of a building and transmission using the amplifier 4 must be carried out at the top of a building at an expensive rental location. The numerous connections previously required between the two floors are now replaced by a single connection.

Figure 3:
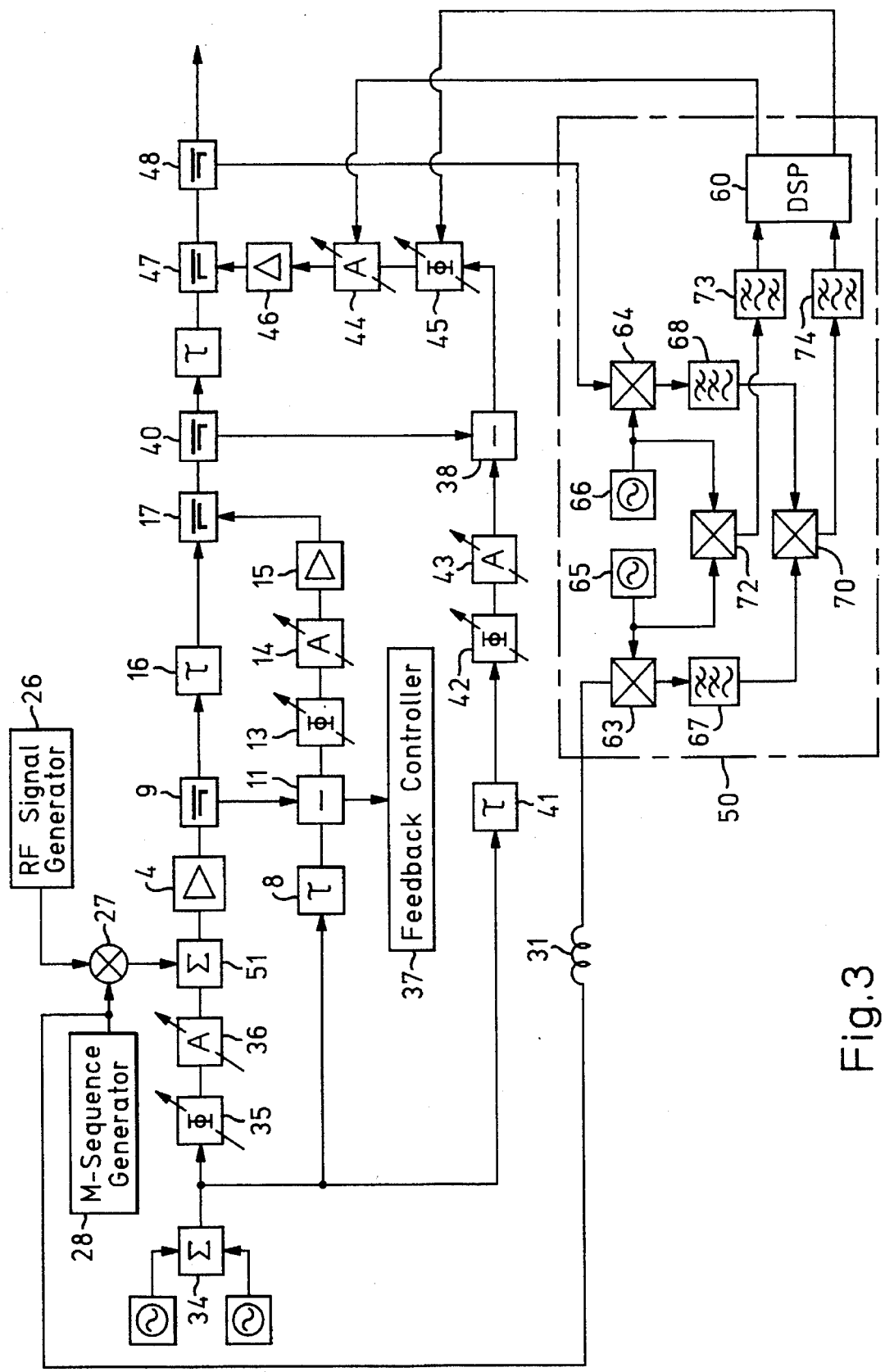

The arrangement of FIG. 3 illustrates that the invention can be applied to a broadband linear amplifier employing several loops for distortion correction and in which the adjustment of phase and gain is applied to the input signals to the main amplifier 4. FIG. 3 has some similarities to FIG. 2 of the above mentioned application but it differs in one important aspect: the two input channels illustrated, which may be representative of many more, are applied to an addition circuit 34 before any phase or gain adjustment is carried out so the two inputs illustrated and the addition circuit 34 can be located at a remote location from the rest of the circuit. This is possible according to the invention because of the spread spectrum correction technique used.

A spread spectrum signal is added to the output of the gain adjustment component 36 in an adder 51, but the components 35, 36 and 51 can be connected between the circuit 34 and the amplifier 4 in any order.

In the multi-loop control system of FIG. 3 a first error signal is produced at the output of the combiner 11 as in FIGS. 1 and 2 but in this case two phase and gain adjustment components 35 and 36 at the output of the addition circuit 34 and in the input path of the amplifier 4 are used instead of the elements 6 and 7 in the path of one of the inputs to the combiner 11. Since FIG. 3 is intended to be a general figure a feedback network 37 is shown which receives as one of its input signals the error signal from the output of the combiner 11 but its other input signal can be taken from a variety of different positions such as the output of the amplifier 15. The network 37 can be used to control either or both of the pairs of phase and gain adjustment components 13 and 14, and 35 and 36 but either pair can, in some circumstances, be manually adjusted initially and left at the original adjustment during operation of the circuit.

In order to improve the cancellation of distortion components a second error signal is derived by a combiner 38 which receives the output signal from the first loop by way of a directional coupler 40 and subtracts the output of the addition circuit 34 received by way of the delay element 41 and phase and gain adjustment components 42 and 43. The second error signal produced by the combiner 38 is applied by way of phase and gain adjustment components 44 and 45 and an amplifier 46 to a directional coupler 47 where cancellation of residual distortion occurs. A final output signal from the circuit of FIG. 2 is taken from a directional coupler 48 to form one input for a feedback network 50 which provides control signals for the adjustment of the phase and gain components 44 and 45. Another feedback network can be used to provide control signals for the components 42 and 43, or these components can be adjusted manually when the circuit is set up but are not then normally adjusted again.

Figure 5:
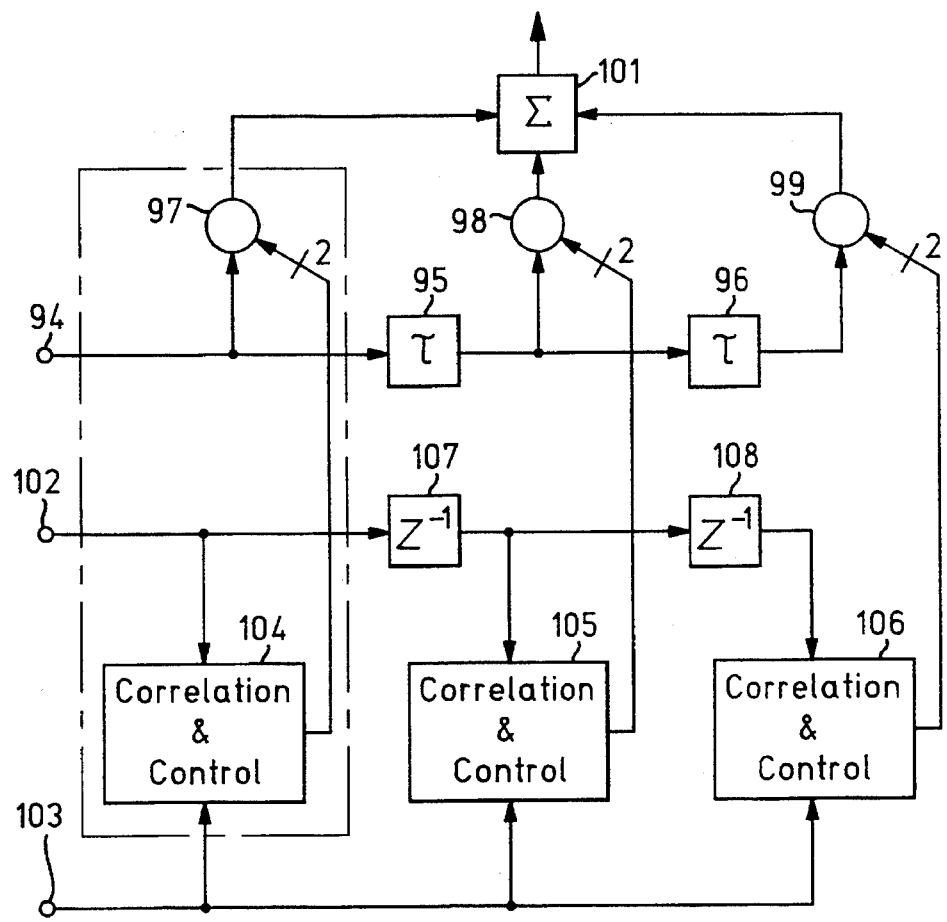
FIG. 5 is a block diagram of a circuit which may be used in a radio repeater where time delayed interference terms may occur.

The network 50 is similar to that shown in FIG. 5 of U.S. Pat. Nos. 5,334,946 and 5,157,345, where a DSP 60 is used, but one of the input signals is from the random sequence generator 28, and the frequencies of oscillators 65 and 66 are different. The random sequence generates a spread spectrum signal at the output of a mixer 63 for application to a mixer 70 where the output spread spectrum signal from the coupler 48, translated in frequency by a mixer 64 forms another input signal. The output of this mixer forms the error signal for the DSP 60. Two oscillators 65 and 66, with output frequencies $f_1$ and $f_2$ chosen to give suitable low frequency inputs to the DSP 60 apply inputs, for frequency translation to the mixers 63 and 64, respectively. Frequencies $f_1$ and $f_2$ may for example be 457.50125 MHz and 457.5 MHz, respectively (assuming the frequency of the generator 26 is 900 MHz and the bandwidth of the M sequence is 30 MHz). The output of the mixer 63 is given by:

$$457.50125 - 30/2 = 442.50125 \text{ MHz}$$

and that of the mixer 64 is at 442.5 MHz after selection of lower side bands by filters 67 and 68. The error signal at the output of the mixer 70 is thus at 1.25 KHz, and this frequency together with an output from a mixer 72 at a reference frequency of 1.25 KHz is applied to the DSP 60. Band pass filters 73 and 74 select sidebands as appropriate. The program for the DSP is again as described in U.S. Pat. Nos. 5,334,946 and 5,157,345.

Nearly all the spread spectrum signal will be removed by cancellation in the directional coupler 17 since it is seen by the feedback network 37 as an error signal at the output of the amplifier 4. This is apparent since the input signal to the combiner 11 which derives the error signal from the addition circuit 34 does not contain the spread spectrum signal. It is only the residue which appears in the circuit output in the directional coupler 48 which provides an error signal for the controller 50 and ensures additional cancellation in the directional coupler 47.

The provision of a spread spectrum signal source for connection to one of the feedback networks on a DSP is not always necessary. For example, the spread spectrum signal from the combiner 38 of FIG. 3 can be used as one input to a network, such as the network 20 or, with suitable frequency translation, a DSP, while the other inputs can be taken from the coupler 48. Both inputs contain corresponding spread spectrum signals, and control signals are derived in the same way as though operating on distortion products, as described in U.S. Pat. Nos. 5,334,946 and 5,157,345.

It is clear that the invention as applied for example to broad band linear amplifiers can be put into operation in many other ways with different arrangements of control loops and feedback networks producing control signals for phase and gain adjustment. In particular each loop may have its own specific spread spectrum correction according to the technique of the present invention. For this purpose a number of orthogonal random sequences, one for each loop, are mixed with the output of the RF signal generator 26 in a plurality of mixers. Circuits such as the network 20, or the network 50 are then provided for each control loop and receive a signal representative of its particular random sequence as a control-input signal.

As has already been pointed out, there are many different ways in which the multiple control loops can be arranged.

A radio repeater in the form of an enhancer for cellular radio using the invention is now described, but this embodiment of the invention could also be modified for a line repeater.

Figure 4:
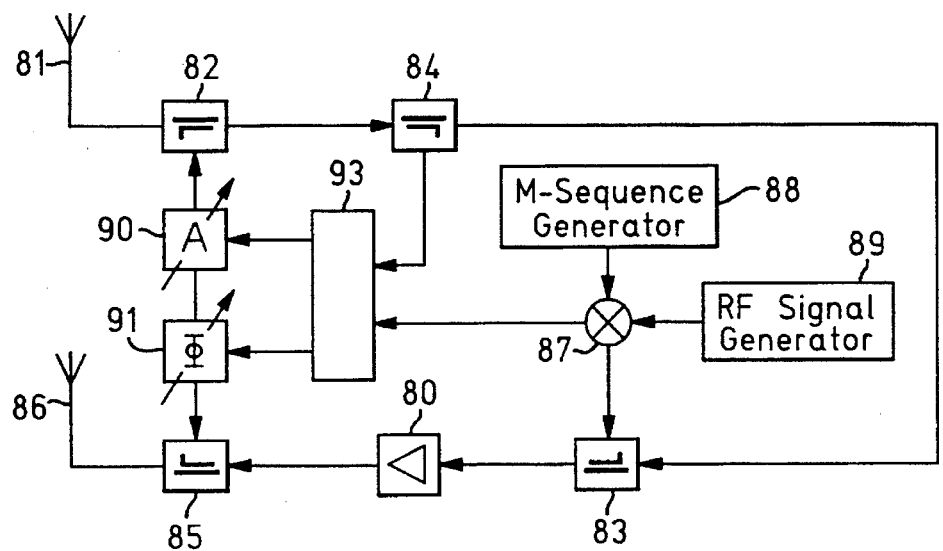
FIG. 4 is a block diagram of a radio repeater according to the invention.

The repeater of FIG. 4 is used where it is required to receive a signal on a frequency, amplify it and re-transmit on the same frequency. Where multiple channels require amplification as in cellular radio systems an amplifier 80 is preferably a broadband linear near amplifier of the type described above or in the above mentioned U.S. Pat. Nos. 5,334,946 and 5,157,345.

Signals received at a receiving antenna 81 pass by way of couplers 82, 84 and 83 to the input of the amplifier 80. The output of the amplifier 80 is connected by way of a coupler 85, acting as a splitter, to a transmit antenna 86. Weak wanted signals are received by the antenna 81, linearly amplified and re-transmitted at the antenna 86 but imperfect isolation between the antennas results in some of the transmitted energy being coupled back into the receive antenna as unwanted, high level, interference which may cause instability. In order to avoid this problem a signal equal to the interference signal and in phase therewith is subtracted from the incoming signal by the coupler 82, acting as a splitter. That part of the signal which has to be subtracted is identified by a spread spectrum reference signal injected into the amplifier input using the coupler 83, acting as a splitter.

The spread spectrum reference signal is generated by using a mixer 87 to mix the outputs of an M-sequence generator 88 and an RF signal generator 89. A portion of the output of the amplifier 80 is removed using the splitter 85 and passed through gain and adjustment components 90 and 91 to form the subtraction signal at the coupler 82 acting as a combiner. A network 93 which may either be of the analogue type described in the above mentioned patent application or, with suitable frequency translation, a DSP receives one input signal from the splitter 84 and one in the form of the spread spectrum reference signal from the mixer 87. Any remaining interference signal in the signal received from the receive antenna after subtraction of a signal nominally equal to the interference signal in the coupler 82, acting as a combiner, is applied to the network 93 and compared with the spread spectrum reference signal. As a result the network 93 provides independent control signals to adjust the amplitude and phase components 90 and 91 giving the correct amplitude and phase for the signal subtracted in the combiner 82.

For cellular applications a bidirectional repeater is required and this can be achieved by using two circuits of the type shown in FIG. 4 (without the antennas 81 and 86), one for each direction of transmission. The two antennas are then connected to the two circuits of FIG. 4 by way of hybrid circuits in the known way.

In situations where scattered (that is time-delayed) interference terms occur they can be resolved and cancelled in a way similar to that described in FIG. 4 but using the arrangement shown in FIG. 5. Such interference terms may arise, for example, from different paths from the transmit antenna 86 to the receive antenna 81. The transmitter output as obtained from the spitter 85 is applied to a terminal 94 where it passes through two delay circuits 95 and 96 which correspond to two time-delayed interference terms. Three adjustment circuits 97, 98 and 99, containing phase and amplitude adjustment components, receive signals from the terminal 94 and the delay circuits 95 and 96, respectively, and provide outputs which are summed in a summer 101 before being applied as the error signal to the combiner 82. Amplitude and phase adjustment control signals for the circuit are derived in a similar way to that shown in FIG. 4 from an M-sequence generator used as a reference signal and applied at a terminal 102, and a signal from the splitter 84 applied at a terminal 103 after down-conversion to base band, for example 0–30 MHz. A network 104 derives the amplitude and phase control signals from the spread spectrum reference signal and the signal from the terminal 103 directly but control signals for the circuits 98 and 99 are derived by circuits 105 and 106 from delayed versions of the reference signal provided by a first, and a second inverse Z transformation, respectively, in circuits 107 and 108. The circuits 107 and 108 each provide a one-bit delay for the digital signals applied at the terminal 102. Although the signals at the terminal 103 are not strictly digital they are sufficiently close at cellular radio frequencies for almost all correlators to function. If necessary, however, these signals could be processed, for instance by a Schmidt trigger circuit, in order to improve waveshape.

The reference signal from the mixer 87 and the signal from the splitter 84 may, in an alternative arrangement, be used without down-conversion to derive amplitude and phase adjustment control signals.

The arrangement of FIG. 5 can be regarded as effectively creating a tapped delay-line filter whose characteristics are frequency dependent. The arrangement is akin to a Rake receiver for spread-spectrum transmissions (see: G. L. Turin, "Introduction to spread-spectrum antimultipath techniques and their application to urban digital radio", Proceedings of the IEEE, Vol. 68, No. 3, March 1980, pp. 328–353; and S. A. Allpress, M. A. Beach, G. Martin and C. M. Simmons, "An investigation of RAKE receiver operation in an urban environment for various spreading bandwidth allocations", "Proceedings of the 42nd IEEE Vehicular Technology Conference", Denver, Colo. May 1992). The lower half of FIG. 5 (circuits 104 to 108) may be implemented digitally in an ASIC. Down-conversion (as mentioned above) is then necessary.

The invention can be put into practice in many other ways where it is required to remove or reduce unwanted signals by cancellation or where a combination of a processed signal or a signal to be processed with a derived signal of controlled amplitude and/or phase improves processing.

We claim:

1. A method of processing signals comprising steps of:

combining a spread spectrum reference signal with an input signal to be processed into a combined signal;

processing said combined signal to provide a processed combined signal;

deriving an intermediate signal dependent on said processed combined signal and Said input signal;

adjusting at least one of a phase and an amplitude of said intermediate signal in response to control signals to form an adjusted intermediate signal;

combining said adjusted intermediate signal with at least one of said combined signal and said processed combined signal to form a resultant signal; and deriving said control signals from said resultant signal.

2. A method of processing signals according to claim 1, wherein:

said step of processing said combined signal comprises amplification;

said step of deriving said intermediate signal comprises deriving an error signal representative of distortion introduced by said amplification; and said step of combining said adjusted intermediate signal comprises subtracting said error signal from at least one of said combined signal and said processed combined signal to provide said resultant signal.

3. A method of processing signals according to claim 1, wherein:

said step of processing said combined signal comprises amplification;

said input signal includes spurious signals; and said step of combining said adjusted intermediate signal signal comprises subtracting said adjusted intermediate signal from said at least one of said combined signal and said processed combined signal to reduce said spurious signals included in said input signal.

4. A method of processing signals according to claim 2 or 3, wherein:

said control signals are derived from a signal representative of said resultant signal and a signal representative of said spread spectrum reference signal.

5. An apparatus for processing signals comprising:
means for combining a spread spectrum reference signal with an input signal to be processed into a combined signal;
means for processing said combined signal to provide a processed combined signal;
means for deriving an intermediate signal dependent on said processed combined signal and said input signal;
means for adjusting at least one of a phase and an amplitude of said intermediate signal in response to control signals to form an adjusted intermediate signal;
means for combining said adjusted intermediate signal with at least one of said combined signal and said processed combined signal to form a resultant signal; and
means for deriving said control signals from said resultant signal.

6. A method of processing signals comprising steps of:
combining a spread spectrum reference signal having a predetermined characteristic with input signals which are not spread spectrum modulated to form a combined signal;
processing said combined signal to provide a processed combined signal;
further processing said processed combined signal; and
extracting an extracted signal representative of said characteristic of said spread spectrum reference signal from said processed combined signal and said input signal to control, at least partially, said further processing of said processed combined signal.

7. A method of processing signals comprising steps of:
combining a spread spectrum reference signal having a predetermined characteristic with input signals which are not spread spectrum modulated to form a combined signal;
processing said combined signal to provide a processed combined signal, said step of processing said combined signal comprising amplification;
further processing said processed combined signal;
extracting an extracted signal representative of said characteristic of said spread spectrum reference signal from said processed combined signal to control, at least partially, said further processing of said processed combined signal
deriving an error signal representative of distortion introduced by said amplification;
subtracting said error signal from at least one of said processed combined signal and said further processed combined signal; and
using said extracted signal to control an amplitude and a phase of said processed combined signal relative to said error signal before said error signal is subtracted from said processed combined signal.

8. A method of processing signals according to claim 6 or 7, wherein said step of extracting said signal representative of said characteristic of said spread spectrum reference signal includes using both an amount of said spread spectrum reference signal remaining in said processed combined signal and said spread spectrum reference signal to derive a signal dependent on said characteristic of said spread spectrum reference signal.

9. A method of processing signals according to claim 8, further comprising steps of:
generating a pre-reference signal at a center frequency of a frequency band of said input signals; and
combining said pre-reference signal with a pseudo random repeatable signal to generate said spread spectrum reference signal.

10. A method of processing signals according to claim 9, wherein said step of extracting said signal representative of said characteristic of said spread spectrum reference signal includes steps of:
recovering a recovered signal representative of said pre-reference signal from said spread spectrum signal in said processed combined signal; and
using both said recovered signal and a signal representative of said pre-reference signal to derive a signal dependent on said characteristic of said spread spectrum reference signal.

11. An apparatus for processing signals comprising:
means for combining a spread spectrum reference signal having a predetermined characteristic with input signals which are not spread spectrum modulated to form a combined signal;
means for processing said combined signal to provide a processed combined signal;
means for further processing said processed combined signal; and
means for extracting an extracted signal representative of said characteristic of said spread spectrum reference signal from said processed combined signal and said input signal to control, at least partially, said further processing of said processed combined signal.

12. A broadband linear amplifier circuit comprising:
amplifier means having an input and an output;
first difference means for deriving an error signal representative of distortion introduced by said amplifier means from signals representative of input signals applied to said input of said amplifier means, said first difference means deriving a difference between a first signal representative of said input signal applied to said amplifier means and a second signal representative of said output signals from said output of said amplifier means;
second difference means for subtracting a signal representative of said error signal from output signals representative of said output of said amplifier means to provide a low distortion output signal;
adjustment means responsive to control signals for adjusting a phase and an amplitude of signals applied to said first difference means simultaneously with a phase and an amplitude of signals applied to said second difference means;
means for generating a spread spectrum reference signal and for combining said spread spectrum reference signal with at least one of said input signals and said signals representative of said input signals; and
control means for generating said control signals from both an amount of said spread spectrum reference signal remaining in said low distortion output signal and a signal representative of one of said spread spectrum reference signal and said error signal.

13. A broadband linear amplifier circuit according to claim 12, wherein said amplifier means comprises:
an amplifier; and
means for correcting distortion introduced by said amplifier by generating an error signal and subtracting said error signal from an output signal from said amplifier.

14. A broadband linear amplifier circuit according to claim 13, wherein said means for generating said spread spectrum reference signal comprises:

means for providing a signal at a center frequency of a band of frequencies to be amplified;

means for providing a series of pulses having a bandwidth equal to that of said band of frequencies, said pulses having a significance according to a pseudo-random repeatable sequence; and means for combining said signal at said center frequency with said series of pulses to provide said spread spectrum reference signal.

15. A broadband linear amplifier circuit comprising:

amplifier means having an input and an output;

first difference means for deriving an error signal representative of distortion introduced by said amplifier means from signals representative of input signals applied to said input of said amplifier means;

second difference means for subtracting a signal representative of said error signal from output signals representative of said output of said amplifier means to provide a low distortion output signal;

adjustment means responsive to control signals for adjusting a relative phase and an amplitude of signals applied to at least one of said first difference means and said second difference means;

means for generating a spread spectrum reference signal and for combining said spread spectrum reference signal with at least one of said input signals and said signals representative of said input signals, said means for generating said spread spectrum reference signal comprising:

means for providing a signal at a center frequency of a band of frequencies to be amplified, means for providing a series of pulses having a bandwidth equal to that of said band of frequencies, said pulses having a significance according to a pseudo-random repeatable sequence, and means for combining said signal at said center frequency with said series of pulses to provide said spread spectrum reference signal; and control means for generating said control signals from both an amount of said spread spectrum reference signal remaining in said low distortion output signal and a signal representative of one of said spread spectrum reference signal and said error signal.

16. A broadband linear amplifier circuit according to claim 15 or 14, wherein said series of pulses comprises pulses having a first amplitude representing a first significance and pulses having a second amplitude representing a second significance.

17. A broadband linear amplifier circuit according to claim 15 or 14, wherein said control means for generating said control signals comprises:

a digital signal processor;

means for supplying an offset signal at a frequency which differs from said center frequency of said band of frequencies by an amount equal to a frequency at which said digital signal processor is to operate;

first, second and third mixer means;

means for supplying a signal representative of said series of pulses to said first mixer means together with said offset signal in deriving an input signal to said second mixer means, which receives said low distortion output signal and provides a first input signal to said digital signal processor;

means for supplying a signal at said center frequency of said band of frequencies to said third mixer means together with said offset signal in deriving a second input signal to said digital signal processor.

18. A broadband linear amplifier circuit according to claim 15 or 14, wherein said control means for generating said control signals comprises:

a digital signal processor;

first and second mixer means;

means for supplying first and second offset signals at respective frequencies which differ by an amount equal to a frequency at which said digital signal processor is to operate, to said first and second mixer means, respectively;

means for supplying a signal representative of said series of pulses to said first mixer means;

means for supplying said low distortion signals to said second mixer means;

third mixer means for receiving said first and second offset signals and for providing a first input to said digital signal processor; and fourth mixer means for receiving outputs of said first mixer means and said second mixer means and for providing a second input to said digital signal processor.

19. A broadband linear amplifier circuit comprising:

amplifier means having an input and an output;

first difference means for deriving an error signal representative of distortion introduced by said amplifier means from signals representative of input signals applied to said input of said amplifier means, said first difference means deriving a difference between a first signal representative of an input signal applied to said amplifier means and a second signal representative of an output signal from said output of said amplifier means;

second difference means for subtracting a signal representative of said error signal from output signals representative of said output of said amplifier means to provide a low distortion output signal;

adjustment means responsive to control signals for adjusting a relative phase and an amplitude of signals applied to at least one of said first difference means and said second difference means;

means for generating a spread spectrum reference signal and for combining said spread spectrum reference signal with at least one of said input signals and said signals representative of said input signals, said means for generating said spread spectrum reference signal comprising:

means for providing a signal at a center frequency of a band of frequencies to be amplified, means for providing a series of pulses having a bandwidth equal to that of said band of frequencies, said pulses having a significance according to a pseudo-random repeatable sequence and means for combining said signal at said center frequency with said series of pulses to provide said spread spectrum reference signal; and control means for generating said control signals from both an amount of said spread spectrum reference signal remaining in said low distortion output signal and a signal representative of one of said spread spectrum reference signal and said error signal.

20. A broadband linear amplifier circuit according to claim 16, wherein said control means for generating said control signals comprises:

a digital signal processor;

means for supplying an offset signal at a frequency which differs from said center frequency of said band of frequencies by an amount equal to a frequency at which said digital signal processor is to operate;

first, second and third mixer means;

means for supplying a signal representative of said series of pulses to said first mixer means together with said offset signal in deriving an input signal to said second mixer means, which receives said low distortion output signal and provides a first input signal to said digital signal processor;

means for supplying a signal at said center frequency of said band of frequencies to said third mixer means together with said offset signal in deriving a second input signal to said digital signal processor.

21. A broadband linear amplifier circuit according to claim 16, wherein said control means for generating said control signals comprises:

a digital signal processor;

first and second mixer means;

means for supplying first and second offset signals at respective frequencies which differ by an amount equal to a frequency at which said digital signal processor is to operate, to said first and second mixer means, respectively;

means for supplying a signal representative of said series of pulses to said first mixer means;

means for supplying said low distortion signals to said second mixer means;

third mixer means for receiving said first and second offset signals and for providing a first input to said digital signal processor; and fourth mixer means for receiving outputs of said first mixer means and said second mixer means and for providing a second input to said digital signal processor.

22. A method of broad band linear amplification comprising steps of:

amplifying input signals to form amplified output signals;

deriving an error signal representative of distortion introduced by said step of amplifying input signals;

subtracting said error signal from said amplified output signals to provide low distortion signals;

simultaneously adjusting a relative phase and an amplitude of at least one of signals used in deriving said error signal, said input signals, and said amplified output signals, in response to control signals;

generating a spread spectrum reference signal;

combining said spread spectrum reference signal with said input signals; and generating said control signals from both an amount of said spread spectrum reference signal remaining in said low distortion signals and a signal representative of at least one of said spread spectrum reference signal and said error signal.

23. A radio repeater comprising:

an amplifier coupled between receive and transmit points;

means for deriving a cancellation signal representative of an output signal from said amplifier;

means for adjusting an amplitude and a phase of said cancellation signal in response to control signals;

difference means for subtracting said cancellation signal from signals received at said receive point;

means for combining signals at said receive point with a spread spectrum reference signal; and means for deriving said control signals from at least one of said spread spectrum reference signal and said signals at said transmit point.

24. A radio repeater according to claim 23, comprising:

means for deriving at least one time delayed further cancellation signal representative of said output signal from said amplifier delayed in time;

means for adjusting at least one of an amplitude and a phase of said further cancellation signal in response to further control signals; and means for deriving said further control signals from said spread spectrum reference signal, delayed in time, and said signals at said transmit point;

wherein said difference means, in operation, subtracts both said cancellation signals and said further cancellation signals from signals received at said receive point to provide said signals at said transmit point.

25. A method of processing a signal comprising the steps of:

combining a spread spectrum reference signal with an input signal to generate a combined signal;

processing said combined signal to provide a processed combined signal;

extracting an intermediate signal dependent upon said processed combined signal;

firstly deriving a first set of control signals;

adjusting at least one of an amplitude and a phase of said intermediate signal in response to said first set of control signals to provide an adjusted intermediate signal;

combining said adjusted intermediate signal with at least one of said combined signal and said processed combined signal to provide a resultant signal;

secondly deriving a second set of control signals;

adjusting at least one of an amplitude and a phase of said resultant signal in response to said second set of control signals to provide an adjusted resultant signal;

wherein said first set of control signals and said second set of control signals enable said phase and said amplitude of said intermediate signal to be adjusted concurrently with said phase and said amplitude of said resultant signal.

26. A method of processing a signal according to claim 25, wherein:

said step of firstly deriving includes deriving said first set of control signals from a signal representative of said resultant signal; and said step of secondly deriving includes deriving said second set of control signals from said resultant signal and a signal representative of said spread spectrum reference signal.

27. A broadband linear amplifier circuit comprising:

amplifier means having an input and an output;

first difference means for deriving an error signal representative of distortion introduced by said amplifier means from signals representative of input signals applied to said input of said amplifier means;

second difference means for subtracting a signal representative of said error signal from output signals representative of said output of said amplifier means to provide a low distortion output signal;

adjustment means responsive to control signals for adjusting a relative phase and an amplitude of signals applied to at least one of said first difference means and said second difference means;

means for adding simulated distortion to at least one of said input signals and said signals representative of said input signals; and control means for generating said control signals from both an amount of said simulated distortion remaining in said low distortion output signal and a signal representative of one of said simulated distortion and said error signal.

28. A broadband linear amplifier circuit according to claim 27, wherein said simulated distortion is added to said at least one of said input signals and said signals representative of said input signals by altering at least one of an amplitude and a phase thereof.

29. A method of processing a signal comprising the steps of:

combining a spread spectrum reference signal with an input signal to generate a combined signal;

processing said combined signal to provide a processed combined signal;

extracting an intermediate signal dependent upon said processed combined signal;

firstly deriving a first set of control signals;

adjusting at least one of an amplitude and a phase of said intermediate signal in response to said first set of control signals to provide an adjusted intermediate signal;

combining said adjusted intermediate signal with at least one of said combined signal and said processed combined signal to provide a resultant signal;

secondly deriving a second set of control signals;

adjusting at least one of an amplitude and a phase of at least one of said adjusted intermediate signal, said combined signal, and said processed combined signal in response to said second set of control signals to provide an adjusted resultant signal;

wherein said first set of control signals and said second set of control signals enable said phase and said amplitude of said intermediate signal to be adjusted concurrently with said phase and said amplitude of said at least one of said adjusted intermediate signal, said combined signal, and said processed combined signal.

30. A broadband linear amplifier circuit comprising:
amplifier means having an input and an output, said amplifier means comprising:

an amplifier, and means for correcting distortion introduced by said amplifier by generating an error signal and subtracting said error signal from an output signal from said amplifier;

first difference means for deriving an error signal representative of distortion introduced by said amplifier means from signals representative of input signals applied to said input of said amplifier means, said first difference means deriving a difference between a first signal representative of said input signal applied to said amplifier means and a second signal representative of said output signals from said output of said amplifier means;

second difference means for subtracting a signal representative of said error signal from output signals representative of said output of said amplifier means to provide a low distortion output signal;

adjustment means responsive to control signals for adjusting a relative phase and an amplitude of signals applied to at least one of said first difference means and said second difference means;

means for generating a spread spectrum reference signal and for combining said spread spectrum reference signal with at least one of said input signals and said signals representative of said input signals, said means for generating said spread spectrum reference signal comprising:

means for providing a signal at a center frequency of a band of frequencies to be amplified, means for providing a series of pulses having a bandwidth equal to that of said band of frequencies, said pulses having a significance according to a pseudorandom repeatable sequence, and means for combining said signal at said center frequency with said series of pulses to provide said spread spectrum reference signal;

control means for generating said control signals from both an amount of said spread spectrum reference signal remaining in said low distortion output signal and a signal representative of one of said spread spectrum reference signal and said error signal.

* * * * *